United States Patent [19]

Noschese

[11] Patent Number: 5,305,879
[45] Date of Patent: Apr. 26, 1994

[54] PACKAGE FOR CARD EDGE CONNECTORS
[75] Inventor: Rocco J. Noschese, Wilton, Conn.
[73] Assignee: Burndy Corporation, Norwalk, Conn.
[21] Appl. No.: 801,987
[22] Filed: Dec. 3, 1991
[51] Int. Cl.⁵ .............................................. B65D 81/00
[52] U.S. Cl. .................................. 206/328; 206/334; 206/564
[58] Field of Search ............... 206/328, 329, 332, 334, 206/331, 560, 564, 565

[56] References Cited

U.S. PATENT DOCUMENTS 3,191,791  6/1965  Jackson .......................... 206/328 X
3,208,589  9/1965  Rayburn .
3,435,949  4/1969  Suverkropp .
4,171,049  10/1979  Nohara et al. .
4,454,949  6/1984  Flum .
4,483,442  11/1984  Worth .
4,632,246  12/1986  Brutosky .
4,671,407  6/1987  Brutosky .
4,842,137  6/1989  Gallagher, Sr. .
4,940,156  7/1990  Cote et al. .
5,012,925  5/1991  Gallagher, Sr. .

Primary Examiner—Bryon P. Gehman
Attorney, Agent, or Firm—Perman & Green

[57] ABSTRACT

A packaging container for elongate electrical connectors includes a base and a cover. The base has a plurality of parallel connector receiving channels. Each channel has a width suitably sized and shaped to receive a row of connectors in an adjacent side-by-side orientation and a length suitably sized and shaped to receive a column of rows of connectors in an adjacent end-by-end orientation. A spacing section between each connector receiving channel and at the outsides of exterior connector channels are provided to allow an unloader's thumb and fingers to be inserted at two of the spacing sections to grasp a row of the connectors with one grasping operation to remove the row of connectors.

16 Claims, 1 Drawing Sheet

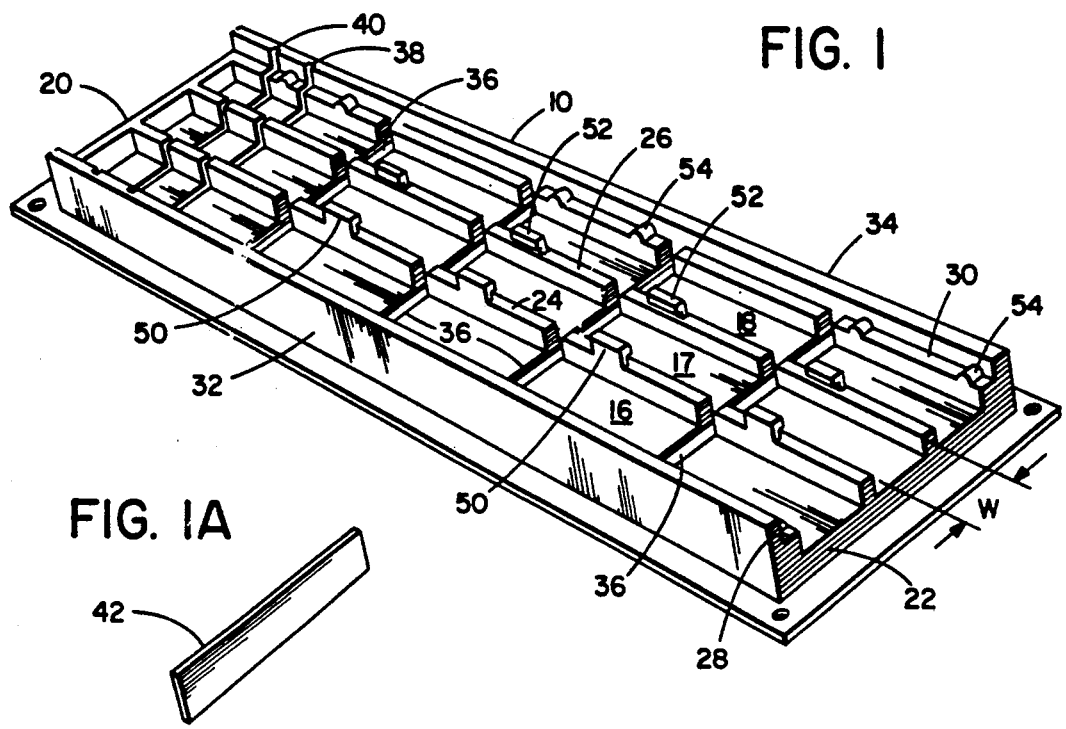
FIG. 1
FIG. 1A
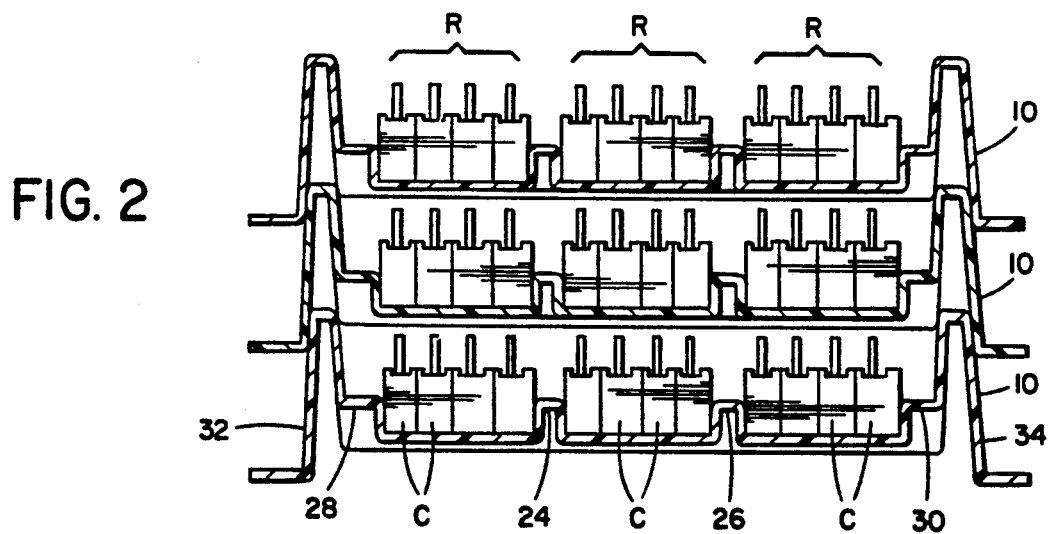
FIG. 2
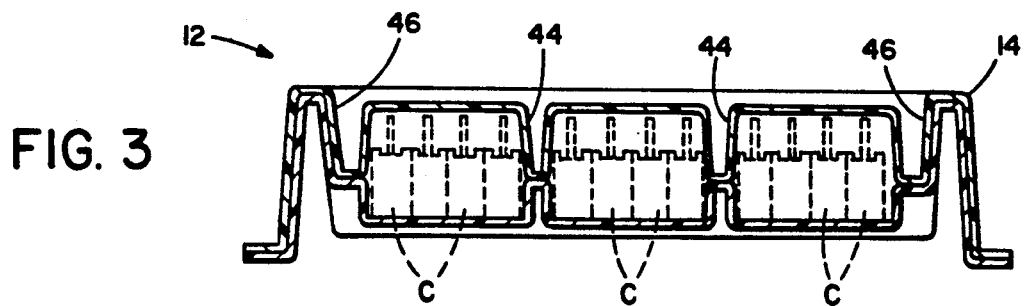
FIG. 3

PACKAGE FOR CARD EDGE CONNECTORS

BACKGROUND OF THE INVENTION

1. Field of the Invention

The present invention relates to a packaging container and, more particularly, to a packaging container for electrical components.

2. Prior Art

U.S. Pat. No. 4,671,407 to Brutosky discloses a tray for card edge connectors having multiple parallel rows that can be stacked with other trays. U.S. Pat. No. 5,012,925 to Gallagher, Sr. discloses slidably housing components inside a base and cover. U.S. Pat. No. 4,171,049 to Nohara et al. discloses a magazine with division plates to change the working length of a groove. Other relevant art includes U.S. Pat. Nos. 4,940,156; 4,483,442; 4,842,137; 4,632,246; 4,454,949; 3,208,589; and 3,435,949.

It is an objective of the present invention to provide a new and improved packaging container for electrical components.

SUMMARY OF THE INVENTION

Problems are overcome and other advantages are provided by a new and improved packaging container for electrical components.

In accordance with one embodiment of the present invention, a packaging container for elongate electrical connectors is provided. The container comprises a base, and a removable cover. The base has a plurality of parallel connector receiving channels. Each channel has a width suitably sized and shaped to receive a row of connectors in an adjacent side-by-side orientation and a length suitably sized and shaped to receive a column of rows of connectors in an adjacent end-by-end orientation. A spacing section is provided between each connector receiving channel and at an exterior of exterior connector channels having a height less than a height of electrical connectors when located in the connector receiving channels and being suitably sized and spaced relative to each other to allow an unloader's thumb and fingers to be inserted at two of the spacing sections to grasp a row of the connectors with one grasping operation to remove the row of connectors. The removable cover is adapted to be mounted to the base and contain the connectors with the base and cover.

In accordance with another embodiment of the present invention, a packaging container for elongate electrical connectors is provided. The container comprises a base, and a cover. The base has an open top and at least three parallel rows of connector receiving channels. Each channel has a width suitably sized to receive a row of adjacent side-by-side electrical connectors and a length suitably sized and shaped to receive a column of adjacent end-by-end electrical connector rows, and means for allowing an unloader of the electrical connectors from the base to be able to grasp a row of the connectors between the unloader's thumb and fingers of a single hand and thereby allow rapid unloading of the base. The cover is adapted to be mounted to the base and contain the connectors between the base and cover.

BRIEF DESCRIPTION OF THE DRAWINGS

The foregoing aspects and other features of the invention are explained in the following description, taken in connection with the accompanying drawings, wherein:

FIG. 1 is a perspective view of a base of a packaging container incorporating features of the present invention.

FIG. 1A is a perspective view of an end stop member that can be used in the base shown in FIG. 1.

FIG. 2 is a cross-sectional view of three bases, as shown in FIG. 1, loaded with electrical connectors and stacked on top of each other.

FIG. 3 is a cross-sectional view of a base having a cover connected to the base.

DETAILED DESCRIPTION OF THE INVENTION

Referring to FIG. 1, there is shown a perspective view of a base 10 of a packaging container 12 (see FIG. 3) for packaging electrical connectors C (see FIGS. 2 and 3). Although the present invention will be described with reference to the single embodiment shown in the drawings, it should be understood that the present invention can be incorporated into different types of embodiments and may be used to package different types of electrical connectors or other articles. In addition, any suitable size, shape, and type of elements, members, or materials could be used.

Referring also to FIGS. 2 and 3, the packaging container 12 includes the base 10 and a cover 14 which are adapted to be connected to each other to house the connectors C therebetween. The base 10 is preferably made of a vacuum formed or molded polymer or thermoplastic material for light weight and includes three parallel connector receiving channels 16, 17, 18. However, any suitable number of channels could be provided. Each channel 16, 17, 18 has a width W suitably sized and shaped to receive a row R of connectors C in an adjacent side-by-side orientation. In the embodiment shown, the connectors C are card edge connectors similar to those shown in U.S. Pat. No. 5,041,023 to Lytle which have an elongate length. However, the packaging container 12 can be suitably configured or adapted to house any suitable type of articles. The connectors C are packaged in an upside-down orientation in order to help protect their solder tails. In the embodiment shown, there are four connectors C to each row R and, the channels 16, 17, 18 each have a length suitably sized and shaped to receive a column of rows of connectors in an adjacent end-by-end orientation. In a preferred embodiment, four to seven rows of connectors of various lengths can be accommodated in each channel. However, the channels 16–18 can be suitably sized and shaped to house any suitable number of connectors in a row or rows in a column. In the embodiment shown, the end 22 of the base 10 is open into the connector receiving channels 16, 17, 18. The open end 22 is provided to allow for relatively easy loading of connectors into the base 10. This can include easily sliding connectors through the open end 22 into the channels 16–18 and, possible robotic or automatic machine feeding of connectors into the base 10 by this slide loading process. The open end 22 can also allow for relatively easy unloading of connectors C from the base 10 by merely sliding them out of the channels 16–18 at the open end 22. The stiffener sections 36 do not interfere with slide loading or unloading of connectors through the channels 16–18.

Located between the channels 16–18 are interior spacing sections 24 and 26 that at least partially define the channels. As best seen in FIG. 2, the spacing sections 24 and 26 have a height less than the height of connectors located in the channels 16-18. The spacing sections 24 and 26 have a suitable width such that an unloader's thumb or fingers can be inserted between adjacent rows of connectors above the spacing sections. The base 10 also has outer spacing sections 28 and 30 located at the inside of side walls 32 and 34. The outer spacing sections 28 and 30 have generally the same height and width as the inner spacing sections 24 and 26.

The base 10 also includes stiffener sections 36. The stiffener sections 36 form slots perpendicular to and extending through the connector receiving channels 16-18. The stiffener sections are provided to structurally stiffen the base such that it can carry a full load of connectors without substantial risk of the base bending too much or breaking. The stiffener sections 36 do not interfere with slide loading or unloading of connectors through the channels 16-18. The base 10 also has end stop slots 38 and 40 at one end of the base 10. These end stop slots 38 and 40 are provided to receive an end stop member 42 (see FIG. 1A). The end stop member 42 can be inserted into either one of the slots 38 or 40 to adjust the effective storage or working length of the connector receiving channels 16-18. The end stop member 42 is used in instances when the columns of connector rows would not fully extend from end 20 to end 22. Thus, in order to avoid the shifting of connectors in the channels 16-18 during shipping, which could cause the connectors to be damaged, the columns are pushed towards end 22 and the end stop member 42 would be inserted.

As can be seen in FIG. 2, the base 10 is suitably sized and shaped to be stacked with other bases having connectors C loaded therein to provide minimum volume and handling. As can be seen in FIG. 3, the cover 14 is removably connected to the base 10 to contain the connectors C between the base and cover. The cover 14 closes over the open ends 20 and 22 of the base. The cover 14 is also preferably comprised of molder polymer material or thermoplastic material. The cover 14 also has interior projections 44 and outer projections 46 that are located at the base spacing sections 24, 26, 28 and 30 to better house the connectors C and prevent them from substantially or significantly moving during shipment.

One of the principal features of the present invention relates to the unloading of the connectors C from the base by an unloader or person who is unloading the connectors from the base for assembly with another component, such as a mother printed circuit board (not shown). It is more time efficient, worker efficient and more comfortable for an unloader to grasp a plurality of connectors directly from its packaging with a single grasping operation with a first hand and then individually connect the connectors to the other component with the other second hand while holding the remainder of grasped connectors in the first hand. This is more efficient and less tiresome on the unloader than individually removing connectors from its packaging one at a time as previously done in the prior art. The base 10 allows this feature to be preformed due to two aspects. First, the width W of the channels 16-18 allow a plurality of connectors to be housed in a row of adjacent side-by-side connectors that do not have significant spaces therebetween. In fact, the connectors C in each row R are so neatly and closely arranged as to provide no spaces between side walls of adjacent connectors C in each row. This allows each row to be easily and firmly grasped without substantial risk that connectors in the grasped row will move relative to each other; at least not until grasping force is reduced. Second, the spacing sections 24, 26, 28 and 30 are suitably sized and located relative to each other such that an unloader's thumb can be inserted at one section and an unloader's fingers of the same hand can be inserted at a nearby second section to allow the unloader to clamp a row of connectors between his thumb and fingers and remove the row of connectors from the base 10 with merely one grasping operation. This increases the rapidity of unloading of the base, at least with respect to the ratio of unloading grasping operations. The present invention allows a greater density of connectors to be contained in a packaging container of a given volume while also making it more time and work efficient and comfortable for the unloader. In addition, as noted above, the base 10 can also be used in automatic machine loading and unloading. The connectors C can also automatically be dispensed from end 22 by providing a slight tilt of the base 10 to allow the connectors to slide or be gravity fed out end 22.

In the embodiment shown in FIG. 1, the base 10 also comprises retension latches 50 and 52. The retension latches 50 and 52 extend from the top of the inner spacing sections 24 and 26, respectively. The latches are sufficiently small in length so as not to substantially interfere with an unloader's positioning of fingers above the inner spacing sections 24 and 26 to grasp a row of connectors. The latches 50 and 52 are adapted to make a snap lock connection with a cooperating section of the cover 14 to hold the cover to the base. Because the base and cover are preferably made of plastic and have some deflectability, the base 10 and cover 14 can be repeatedly connected and disconnected with relative ease. Additional or alternative means for connecting the base and cover could also be provided.

In the embodiment shown, the base 10 also comprises elevation bumps 54. The elevation bumps 54 are provided on the outer spacing sections 28 and 30. The elevation bumps 54 are adapted to either be received in a cooperating recess of cover 14, in which case the cover 14 will sit relatively low on the base 10, or are not received in a cooperating recess of the cover 14, in which case the cover will sit on the base 10 at a slightly higher position. Thus, the base and cover can be arranged to accommodate different heights of connectors C, but nonetheless, still provide close tolerances with the connector height. In a preferred embodiment, the elevation bumps 54 and recesses in the cover for the elevation bumps are arranged such that the two conditions, compact connection and elevated connection, can be switched by merely rotating the cover 180 degrees such that the end of the cover 14 that would have been located at end 22 is now located at end 20. To accomplish this, the elevation bumps 54 are arranged in an asymmetrical pattern on the base 10. However, any suitable type of means to vary height connection between the base and cover could be provided including use of a different height cover. It should also be understood that the elevation bumps 54 need not be provided.

Let it be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A packaging container for elongate electrical connectors, the container comprising:

a base having a plurality of parallel connector-receiving channels, each channel has a width suitably sized and shaped to receive a row of connectors in an adjacent side-by-side orientation and a length suitably sized and shaped to receive a column of rows of connectors in an adjacent end-by-end orientation, a spacing section between each connector-receiving channel and at an exterior of exterior connector channels having a height less than a height of electrical connectors when located in the connector-receiving channels, the spacing sections being suitably sized and spaced relative to each other to allow an unloader's thumb and fingers to be inserted at two of the spacing sections to grasp a row of the connectors with one grasping operation to remove the row of connectors from one of the channels; and a removable cover adapted to be mounted to the base and contain the connectors with the base and cover.

2. A container as in claim 1 wherein the base has at least one open end into the connector-receiving channels.

3. A container as in claim 1 wherein the base has at least one slot perpendicular to and extending through the connector-receiving channels.

4. A container as in claim 3 further comprising at least one end stop member insertable into the at least one slot.

5. A container as in claim 1 further comprising means for adjusting an effective working length of the connector-receiving channels.

6. A container as in claim 1 wherein the base is suitably sized and shaped to be stacked on another base with electrical connectors therein.

7. A container as in claim 1 wherein the base further comprises stiffeners transverse to the connector-receiving channels.

8. A container as in claim 1 wherein the base and cover are comprised of a molded polymer material for light weight.

9. A container as in claim 1 wherein the connector-receiving channels are each suitably sized and shaped to receive four side-by-side card edge connectors.

10. A packaging container for elongate electrical connectors, the container comprising:

a base having an open top and at least three parallel rows of connector receiving channels, each channel having a width suitably sized to receive a row of adjacent side-by-side electrical connectors and a length suitably sized and shaped to receive a column of adjacent end-by-end electrical connector rows, and means for allowing an unloader of the electrical connectors from the base to be able to grasp a row of the connectors between the unloader's thumb and fingers of a single hand and thereby allow rapid unloading of the base; and a cover adapted to be mounted to the base and contain the connectors between the base and cover.

11. A container as in claim 10 wherein the means for allowing comprises spacers between the channels and at the outer sides of the outer channels to provide a space adjacent the rows of electrical connectors for the unloader's thumb and fingers.

12. A container as in claim 10 wherein the channels have at least one open end.

13. A container as in claim 10 further comprising an end stop member connectable to the base to alter effective storage length of the channels.

14. A container as in claim 10 wherein the base includes stiffeners molded into the base transverse to the channels.

15. A container as in claim 10 further comprising means to position the cover at two different positions on the base.

16. A container as in claim 10 further comprising means for snap lock connecting the cover to the base.

* * * * *